(12) United States Patent
Aksyuk et al.

(10) Patent No.: US 6,265,239 B1
(45) Date of Patent: Jul. 24, 2001

(54) MICRO-ELECTRO-MECHANICAL OPTICAL DEVICE

(75) Inventors: Vladimir Anatolyevich Aksyuk, Piscataway; David John Bishop, Summit, both of NJ (US)

(73) Assignees: Agere Systems Optoelectronics Guardian Corp., Orlando, FL (US); Lucent Technologies Inc, Murray Hill, NJ (US)

( * ) Notice: Subject to any disclaimer, the term of this patent is extended or adjusted under 35 U.S.C. 154(b) by 0 days.

(21) Appl. No.: 09/390,580

(22) Filed: Sep. 3, 1999

Related U.S. Application Data

(63) Continuation-in-part of application No. 08/997,175, filed on Dec. 22, 1997, now Pat. No. 5,994,159.
(51) Int. Cl.$^7$ .................................................. H01L 21/00
(52) U.S. Cl. .................................. 438/52; 438/51; 438/48
(58) Field of Search ................................ 438/27, 29, 48, 438/50–52; 257/98, 415

(56) References Cited

U.S. PATENT DOCUMENTS 5,903,380   5/1999   Motamedi et al. .................. 359/224
5,994,159 * 11/1999   Aksyuk et al. ........................ 438/52

OTHER PUBLICATIONS

Chen et al., *IEEE*, "A Low Voltage Micromachined Optical Switch By Stress–Induced Bending", pp. 424–428, 1999.
Cowan et al., *SPIE*, "Vertical Thermal Actuators for Micro–Opto–Electro–Mechanical Systems", vol. 3226, pp. 137–146, 1997.

\* cited by examiner

*Primary Examiner*—David Nelms
*Assistant Examiner*—Dung A Le
(74) *Attorney, Agent, or Firm*—Richard J. Botos

(57) ABSTRACT

A method for pivoting an optical device about one or more axes thereof is disclosed. Springs couple the optical device to the micro-electro-mechanical structure. A portion of the springs are fastened on the micro-electro-mechanical structure. Fastening the portion of each spring on the electromechanical structure prevents the springs from moving the optical device in a translational direction when such optical device pivots about the one or more axes.

14 Claims, 4 Drawing Sheets

MICRO-ELECTRO-MECHANICAL OPTICAL DEVICE

RELATED APPLICATIONS

This application is a continuation-in-part of application Ser. No. 08/997175 filed on Dec. 22, 1997 now U.S. Pat. No. 5,994,159.

FIELD OF THE INVENTION

The present invention relates generally to optical communication systems and more particularly, to micro-electro-mechanical optical devices.

DESCRIPTION OF THE RELATED ART

Optical communication systems typically include a variety of optical devices (e.g., light sources, photodetectors, switches, attenuators, mirrors, amplifiers, and filters). The optical devices transmit, modify, or detect optical signals in the optical communications systems. Some optical devices are coupled to micro-electro-mechanical structures (e.g., thermal actuators) forming a micro-electro-mechanical optical device. The term micro-electro-mechanical structure as used in this disclosure refers to a structure that moves mechanically under the control of an electrical signal. The microelectro-mechanical structure moves the optical devices from a first position to a second position.

Typically, both the micro-electro-mechanical structure and the optical device are fabricated by patterning a plurality of material layers formed on a substrate. However, the typical range of motion for the optical device perpendicular to the substrate is limited to the thicknesses of the material layers. In particular, such a limited range of motion for the optical devices also limits the size of the optical device, the angle of rotation for the optical device, or both.

Therefore, methods for increasing the range of motion of an optical device continue to be sought.

SUMMARY OF THE INVENTION

The present invention is directed to a method for pivoting an optical device about one or more axes thereof. In one embodiment of the present invention, springs couple the optical device to the micro-electro-mechanical structure. The micro-electro-mechanical structure lifts the optical device above the plane of the substrate surface. The microelectro-mechanical structure includes an engagement plate. A first end of each spring is coupled to the engagement plate. A second end of each spring is coupled to the optical device.

A portion of the spring near the second end is optionally held on the engagement plate with one or more braces. The braces are made of one or more strips of material. Holding the portion of each spring on the micro-electro-mechanical structure with braces prevents the optical device from moving in a translational direction when such optical device pivots.

After the optical device is lifted above the plane of the substrate surface, an electrostatic field is generated between the lifted optical device and the substrate surface. The electrostatic field is generated by applying a bias voltage between the optical device and a portion of the substrate surface.

The electrostatic field pivots the optical device, deflecting an edge thereof toward the substrate surface. The optical device pivots about an axis defined by the springs. The deflection distance of the optical device depends on the amount of the applied bias voltage.

Both the substrate and the optical device are preferably conductive so that the bias voltage may be applied thereto. When either of the substrate or the optical device are insufficiently conductive to deflect such optical device toward the substrate surface, conductive layers (e.g., electrodes) are optionally formed on regions thereof.

The engagement plate is optionally coupled to one or more intermediate structures which are then coupled to the optical device. The one or more intermediate structures are coupled to both the engagement plate and the optical device with springs. The one or more intermediate structures allow multi-axis rotation for the optical device coupled thereto. A plurality of electrodes are optionally disposed on the substrate surface proximate to both the intermediate structures and the optical device to permit substantially independent rotation of the optical device around the multiple axes.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

Figure 1:
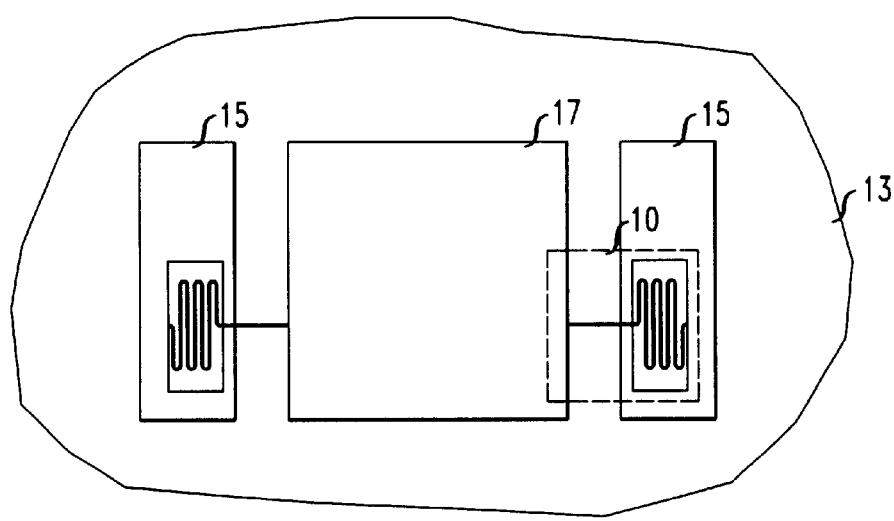
FIG. 1 depicts a top view of a substrate wherein an optical device is coupled to a micro-electro-mechanical structure with springs.

The present invention is directed to a micro-electro-mechanical optical device suitable for use in optical communication systems. Referring to FIG. 1, the micro-electromechanical optical device includes a micro-electro-mechanical structure 15 and an optical device 17 disposed on a surface of a substrate 13. The micro-electro-mechanical structure 15 is coupled to the optical device 17. The micro-electro-mechanical structure 15 lifts the optical device above the plane of the substrate surface 13.

Figure 2:
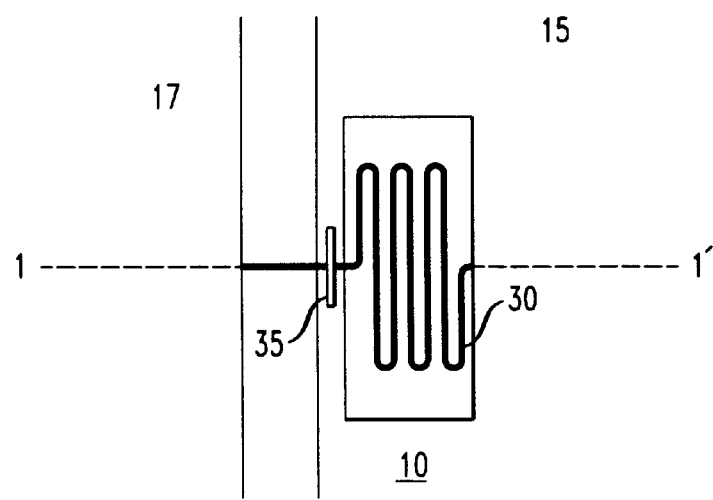
FIG. 2 shows an expanded view of area 10 in FIG. 1.

FIG. 2 is an expanded view of area 10, depicted in FIG. 1. A spring 30 couples the optical device 17 with the micro-electro-mechanical structure 15.

A portion of the spring 30 is optionally held on the micro-electro-mechanical structure 15 with one or more braces 35. The braces 35 are made of one or more strips of material. Holding the portion of the spring 30 on the micro-electro-mechanical structure 15 with the braces 35 prevents the optical device from moving in a translational direction when the optical device pivots around an axis 1—1'.

Figure 3:
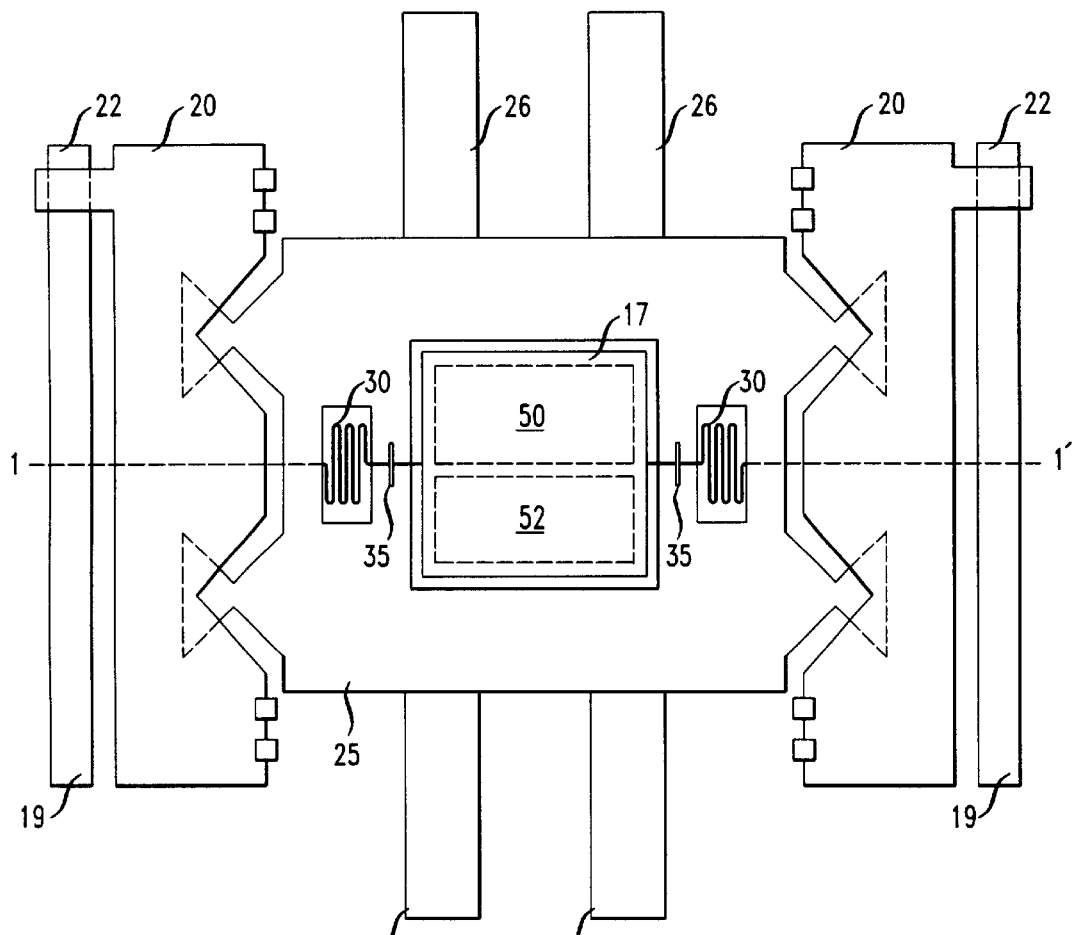
FIG. 3 depicts one configuration of the micro-electro-mechanical structure shown in FIG. 1.

Referring to FIG. 3, the micro-electro-mechanical structure 15 includes a plurality of beams 19, 26. A first end 22 of beams 19 is coupled to plates 20 in hinged attachment with the substrate surface 13. The hinged plates includes a v-shaped notch. The hinged plates 20 are coupled to an engagement plate 25. The engagement plate 25 is also coupled to the optical device 17 with a pair of springs 30. A first end of beams 26 is coupled to the engagement plate 25. A second end of beams 26 is coupled to the substrate surface 13. When unassembled the beams 19, 26, the hinged plates 20, the engagement plate 25, and the optical device 17 lie flat on the substrate surface 13.

The engagement plate 25 has a plurality of v-shaped notches. The v-shaped notches on the engagement plate 25 correspond to the v-shaped notches on the hinged plates 20.

Figure 4:
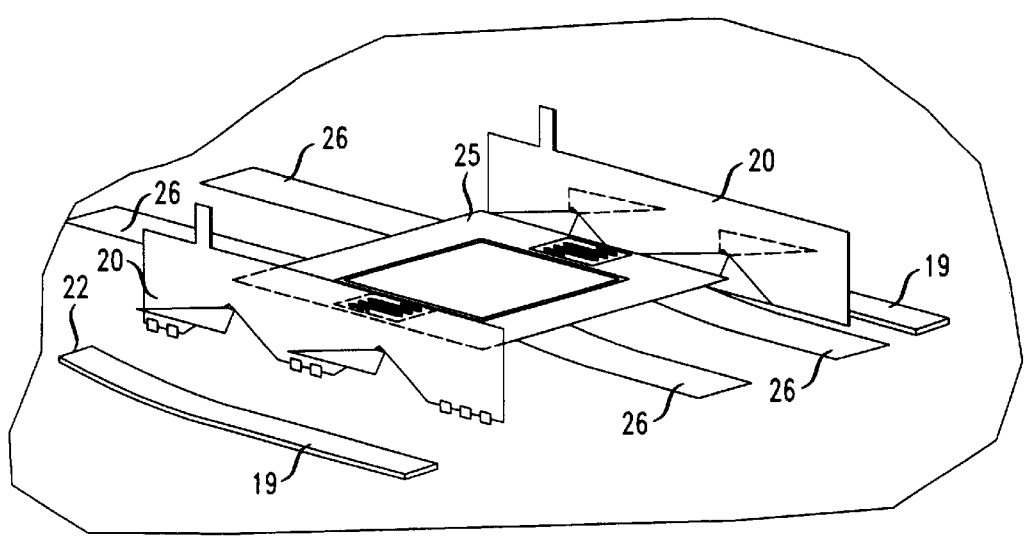
FIG. 4 is a side view of the structure of FIG. 3 after the optical device is lifted above the plane of the substrate surface.

Referring to FIG. 4, the first ends 22 of the beams 19 lift in an upward direction, substantially in an arc, above the plane of the substrate surface in response to the application of an activation force. As the first ends 22 of the beams 19 are lifted above the plane of the substrate surface, they rotate the hinged plates 20 out of the plane of the substrate.

When the hinged plates 20 are rotated out of the plane of the substrate, the beams 26 lift the engagement plate 25 as well as the optical device above the plane of the substrate. As the engagement plate is lifted above the plane of the substrate, the pair of v-shaped notches on the engagement plate 25 slide into the v-shaped notch on the hinged plate 20. When the engagement plate 25 is lifted, it completes the rotation of the hinged plate 20 started by the beams 19 so that the hinged plates are about ninety degrees out of the plane of the substrate. The height of the v-shaped notch on the hinged plate 20 limits the height to which the optical device is lifted and holds it in a fixed, well-defined position.

A variety of activation forces can be applied to the micro-electro-mechanical structure to lift the first ends 22 of the beams 19, 26. Suitable activation forces include thermal expansion, intrinsic stress, scratch drives, and electromagnetic forces. Illustrative micro-electro-mechanical structures based on thermal expansion are discussed in Cowan, William D., et al., "Vertical Thermal Actuators for Micro-Opto-Electro-Mechanical Systems", SPIE, Vol. 3226, pp. 137–146 (1997), intrinsic stress are discussed in copending application Ser. No. 09/xxxxxxx, scratch drives are discussed in Akiyam, T. et al., "A Quantitative Analysis of Scratch Drive Actuator Using Buckling Motion", Proc. $8^{th}$ IEEE International MEMS Workshop, pp. 310–315 (1995) and electromechanical structures based on electromagnetic forces are discussed in Busch-Vishniac, I. J., "The Case for Magnetically Driven Microactuators", Sensors and Actuators A, A33, pp. 207–220, (1992).

After the electromechanical structure 15 lifts the optical device 17 above the plane of the substrate, the lifted optical device 17 is moveable in response to an electrostatic field generated between the optical device 17 and the substrate surface 13. The electrostatic field is generated by applying a bias voltage between the optical device 17 and a portion of the substrate surface 13.

Referring to FIG. 3, when the electrostatic field is generated between the optical device 17 and the substrate 13, such electrostatic field pivots such optical device 17 around an axis 1—1', corresponding to the axes of the springs. When the braces 35 optionally hold spring on a portion of the engagement plate such springs prevent the optical device 17 from substantially moving in a translational direction.

Both the substrate and the optical device are preferably conductive so that the bias voltage may be applied thereto. When either of the substrate or the optical device are insufficiently conductive to deflect such optical device toward the substrate surface, conductive layers (e.g., electrodes) are optionally formed on regions thereof. Referring to FIG. 3, electrodes 50, 52 on the substrate surface under optical device 17 are used to generate the electrostatic field.

Figure 5:
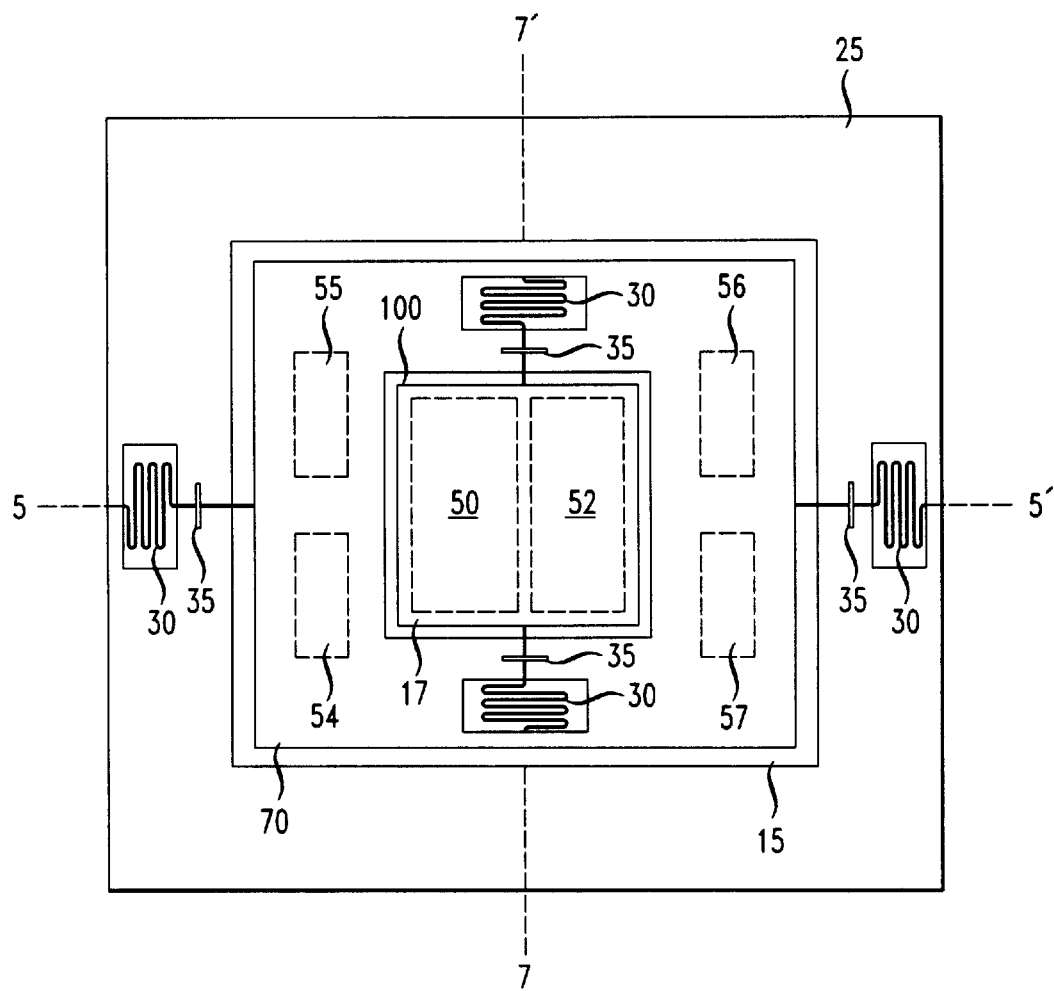
FIG. 5 is an alternate configuration of the micro-electro-mechanical structure shown in FIG. 1 with multi-axis rotation.

Alternatively, referring to FIG. 5, the optical device 17 is coupled to an intermediate plate 70 which is coupled to the engagement plate 25. The intermediate plate 70 is coupled to both the optical device 17 and the engagement plate 25 with a plurality of springs 30. Braces 35 optionally hold portions of the springs on either the intermediate plate 70 or the engagement plate 25. Electrodes 54, 55, 56, and 57 are used to rotate the intermediate plate 70 as well as the optical device 17 coupled thereto about the axis, denoted as 5—5'. Electrodes 50, 52 are used to rotate the optical device 17 around the axis denoted as 7—7'.

The optical device 17, intermediate plate 70, and engagement plate 25 are depicted in FIG. 5 with rectangular or square shapes. Other suitable shapes for the optical device, the intermediate plate, and engagement plate include circular. The electrode shapes are typically tailored to maximize the tilt range of the optical device.

The micro-electro-opto-mechanical device of the present invention is fabricated by providing a substrate that is suitably prepared (i.e., doped, as appropriate) and cleaned. Suitable substrate materials include silicon, gallium arsenide, indium phosphide, germanium or indium tin oxide (ITO) coated glass.

A plurality of material layers are formed in a planar arrangement on a surface of the substrate. Examples of suitable material layers include polysilicon, silicon nitride, and silicon dioxide.

After each of material layer of the plurality of material layers are formed on the substrate, each material layer is patterned to form a micro-electro-mechanical structure as well as an optical device. For example, the electro-opto-mechanical device shown in FIG. 3, including a mirror 17 as well as beams 19, 26 is fabricated using a Multi-User MEMS Process (MUMPS) provided by the MCNC MEMS Technology Applications Center, MCNC, Research Triangle Park, North Carolina (see SmartMUMPs Design Handbook at mems.mcnc.org).

In the MUMPS process the micro-electro-mechanical structure and the optical mirror are formed in polysilicon layers, oxide layers (e.g., phosphosilicon glass) provides sacrificial layers, and silicon nitride electrically isolates the micro-electro-mechanical structure and optical mirror from the substrate. The micro-electro-mechanical structure and optical mirror are formed in the polysilicon layers with multiple photolithography steps.

Photolithography is a process which includes the coating of one or more of the polysilicon layers and phosphosilicon glass layers with a photoresist (i.e., an energy sensitive material), exposure of the photoresist with an appropriate mask, and developing the exposed photoresist to create the desired etch mask for subsequent pattern transfer into the one or more underlying polysilicon layers and phosphosilicon glass layers. The pattern defined in the photoresist is transferred into the one or more underlying polysilicon layers and phosphosilicon glass layers by etching for example in a reactive ion etch (RIE) system.

The following example is provided to illustrate a specific embodiment of the present invention.

EXAMPLE 1

A micro-electro-mechanical optical device having the structure depicted in FIG. 3 was obtained from the MEMS Technology Application Center, MCNC, Research Triangle Park, North Carolina. The micro-electro-mechanical optical device was disposed on a surface of a silicon substrate. The silicon substrate had a resistivity of about 1–2 ohm-cm. A multi-layered planar arrangement of alternating polysilicon layers (POLY0, POLY1 and POLY2) and phosphosilicon glass layers (OX1 and OX2), formed over a 600 nm (nanometer) thick silicon nitride layer was formed on the silicon substrate.

The polysilicon layers POLY0, POLY1 and POLY2 had thicknesses of about 0.5 $\mu$m (micrometers), 2.0 $\mu$m, and 1.5 $\mu$m, respectively. The phosphosilicon glass layers OX1 and OX2 had thicknesses of about 2 $\mu$m and 1.5 $\mu$m, respectively. A 0.5 $\mu$m layer of Cr/Au was formed on the POLY2 layer.

The silicon nitride layer, the polysilicon layers (POLY0, POLY1 and POLY2), the phosphosilicon glass layers (OX1 and OX2), and the Cr/Au layer were formed on the silicon substrate using low pressure deposition techniques.

Referring to FIG. 3, the electromechanical structure 15 and the optical device 17 were defined in the multi-layered planar arrangement using photolithographic techniques. The electromechanical structure included two beams 19, 26 each coupled at one edge to a plate 20 in hinged attachment with the substrate. The beams 19 each had a width of about 50 $\mu$m and a length of about 300 $\mu$m. The beams 26 had a width of about 100 $\mu$m and a length of about 500 $\mu$m. The beams were defined in the POLY1 and POLY2 layers. Beams 19, 26 also had Cr/Au layer deposited thereon to create intrinsic stresses, making them curl and assemble the structure.

The hinged plates 20 had a width of about 500 $\mu$m and a height of about 75 $\mu$m. The v-shaped notch had a notch height of about 50 $\mu$m. The hinged plates 20 were defined in the POLY2 and POLY1 layers.

The engagement plate 25 had a length of about 500 $\mu$m and a width of about 500 $\mu$m. Each v-shape notch had a notch height of about 75 $\mu$m. The engagement plate 25 was defined in the POLY1 and POLY2 layers.

The optical device was a mirror having dimensions of about 400 $\mu$m×400 $\mu$m. The optical device was defined in the POLY1, POLY2, and Cr/Au layers.

An edge of the optical device was coupled to the engagement plate with springs 30. The springs are defined in the POLY1 and POLY2 layers. The springs are braced on the engagement plate with braces 35, defined in the POLY1 and POLY2 layers.

The electrodes 50, 52 were about 200 $\mu$m long and about 100 $\mu$m wide and were formed using POLY0.

Each fabrication step mentioned above was performed at the MEMS Technology Application Center, MCNC, Research Triangle Park, North Carolina.

After the electromechanical structure and the optical device were defined in the POLY0, POLY1, POLY2, OX1, OX2, and Cr/Au layers, the electromechanical structure and the optical device were released from the surface of the silicon substrate by etching the phosphosilicon glass layers in a bath of 49% HF at room temperature for about 1–2 minutes.

After the phosphosilicon glass layers were removed, the beams rotated the hinged plate and lifted the engagement plate as well as the optical device off of the substrate surface. The optical device was lifted to a height of about 50 $\mu$m above the substrate surface.

A voltage of about 100 V was applied between the optical device and pad 50 on the substrate surface. After the voltage was applied between the optical device and pad 50 the optical device pivoted about axis 1—1' (FIG. 3), so that the optical device was at an angle of about 5° with respect to the substrate surface.

EXAMPLE 2

A micro-electro-mechanical optical device having the structure depicted in FIG. 5 was formed. The electromechanical optical device was formed on a surface of a silicon substrate. The silicon substrate had six 0.5 $\mu$m thick POLY0 pads 50, 52, 54, 55, 56 and 57 on regions thereof. The micro-electro-mechanical optical device was formed with the fabrication steps described in Example 1. The optical device was lifted above the surface of the substrate to a substantially planar orientation with respect to the substrate surface as described in Example 1.

A voltage of about 100 V was applied between the optical device and pads 50, 55, and 56, underlying the optical device 17 on the substrate surface. When the voltage was applied between the optical device and pads 50, 55, and 56 the optical device pivoted about axis 7—7' and axis 5—5' (FIG. 5), so that the optical device was tilted an angle of about 5° with respect to the substrate surface so that the corner denoted as 100 was the point closest to the substrate surface.

The invention claimed is:

1. A method for pivoting an optical device, comprising the steps of:
   providing a substrate having an optical device and a micro-electromechanical structure disposed on a surface thereof, wherein the micro-electro-mechanical structure is coupled to the optical device with a plurality of springs;
   lifting the optical device above the plane of the substrate surface by applying an activation force to the micro-electro-mechanical structure; and
   pivoting the optical device around at least one axis thereof by generating an electric field between the optical device and the substrate.

2. The method of claim 1 wherein the portion of the spring is fastened on the micro-electro-mechanical structure with one or more braces.

3. The method of claim 2 wherein each brace comprises one or more material layers.

4. The method of claim 1 wherein the optical device is an optical mirror.

5. The method of claim 1 wherein the micro-electro-mechanical structure includes a plurality beams, a plurality of plates in hinged attachment with the substrate and at least one engagement plate, wherein each hinged plate includes at least one v-shaped notch, wherein the engagement plate has at least one pair of v-shaped notches, wherein each pair of v-shaped notches on the engagement plate is within the notch on the hinged plate, and wherein the beams lift the engagement plates above the plane of the substrate surface in response to the activation force.

6. The method of claim 5 wherein each beam of the plurality of beams comprise one or more material layers.

7. The method of claim 6 wherein a first material layer is characterized by a first coefficient of thermal expansion and a second material layer is characterized by a second coefficient of thermal expansion different from the first coefficient of thermal expansion.

8. The method of claim 6 wherein at least one of the one or more material layers has an intrinsic stress.

9. The method of claim 6 wherein at least one of the one or more material layers has a stress gradient.

10. The method of claim 6 wherein the one or more material layers are selected from the group consisting of silicon nitride, polysilicon, silicon dioxide, and metal.

11. The method of claim 10 wherein the metal is a chromium/gold multilayer.

12. The method of claim 1 wherein the electric field is generated by applying a bias voltage between the optical device and at least a portion of the surface of the substrate.

13. The method of claim 1 wherein the electric field is generated by applying a bias voltage between the optical device and at least one electrode on the surface of the substrate.

14. The method of claim 12 wherein the bias voltage applied between the optical device and the substrate is less than about 1000 V.

* * * * *